(12) United States Patent
Manatad

(10) Patent No.: US 7,217,594 B2
(45) Date of Patent: May 15, 2007

(54) ALTERNATIVE FLIP CHIP IN LEADED MOLDED PACKAGE DESIGN AND METHOD FOR MANUFACTURE

(75) Inventor: Romel N. Manatad, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 182 days.

(21) Appl. No.: 10/772,064

(22) Filed: Feb. 3, 2004

(65) Prior Publication Data

US 2004/0157372 A1  Aug. 12, 2004

Related U.S. Application Data

(60) Provisional application No. 60/446,918, filed on Feb. 11, 2003.

(51) Int. Cl.
  *H01L 21/44* (2006.01)
  *H01L 21/48* (2006.01)
  *H01L 21/50* (2006.01)

(52) U.S. Cl. ............... 438/108; 438/116; 438/123; 438/124; 257/E23.128

(58) Field of Classification Search ........... 438/108, 438/116, 123, 124; 257/E23.128
See application file for complete search history.

(56) References Cited

U.S. PATENT DOCUMENTS

| | | | |
|---|---|---|---|
| 5,637,916 A | 6/1997 | Joshi | |
| 5,765,280 A | 6/1998 | Joshi | |
| 5,789,809 A | 8/1998 | Joshi | |
| 5,869,883 A * | 2/1999 | Mehringer et al. | 257/667 |
| 6,133,634 A | 10/2000 | Joshi | |
| 6,294,403 B1 | 9/2001 | Joshi | |
| 6,392,290 B1 * | 5/2002 | Kasem et al. | 257/678 |
| 6,392,429 B1 * | 5/2002 | Hembree et al. | 324/755 |
| 6,469,384 B2 | 10/2002 | Joshi | |
| 6,489,678 B1 | 12/2002 | Joshi | |
| 6,566,749 B1 | 5/2003 | Joshi et al. | |
| 6,627,991 B1 | 9/2003 | Joshi | |
| 6,633,030 B2 | 10/2003 | Joshi | |
| 6,661,082 B1 | 12/2003 | Granada et al. | |
| 6,683,375 B2 | 1/2004 | Joshi et al. | |
| 6,696,321 B2 | 2/2004 | Joshi | |
| 6,720,642 B1 | 4/2004 | Joshi et al. | |
| 2002/0047501 A1 * | 4/2002 | Tsuda et al. | 310/348 |
| 2002/0066950 A1 | 6/2002 | Joshi | |
| 2002/0066959 A1 | 6/2002 | Joshi | |
| 2002/0100962 A1 | 8/2002 | Joshi | |
| 2002/0125550 A1 | 9/2002 | Estacio | |
| 2002/0192935 A1 | 12/2002 | Joshi et al. | |
| 2003/0011005 A1 | 1/2003 | Joshi | |
| 2003/0042403 A1 | 3/2003 | Joshi | |
| 2003/0059979 A1 * | 3/2003 | Ukita et al. | 438/113 |
| 2003/0075786 A1 * | 4/2003 | Joshi et al. | 257/676 |
| 2003/0107126 A1 | 6/2003 | Joshi | |
| 2003/0122247 A1 | 7/2003 | Joshi | |

(Continued)

*Primary Examiner*—William M. Brewster
(74) *Attorney, Agent, or Firm*—Townsend and Townsend and Crew LLP

(57) ABSTRACT

A semiconductor package is disclosed. The package includes a leadframe structure comprising a die attach region and plurality of leads. A molding material is molded around at least a portion of the leadframe structure, and comprises a window. A semiconductor die comprising an edge is mounted on the die attach region and is within the window. A gap is present between the edge of the semiconductor die and the molding material.

15 Claims, 4 Drawing Sheets

U.S. PATENT DOCUMENTS

2003/0173684 A1 9/2003 Joshi et al.
2003/0193080 A1 10/2003 Cabahug et al.
2003/0197278 A1 10/2003 Joshi et al.
2004/0041242 A1 3/2004 Joshi
2004/0056364 A1 3/2004 Joshi et al.

* cited by examiner

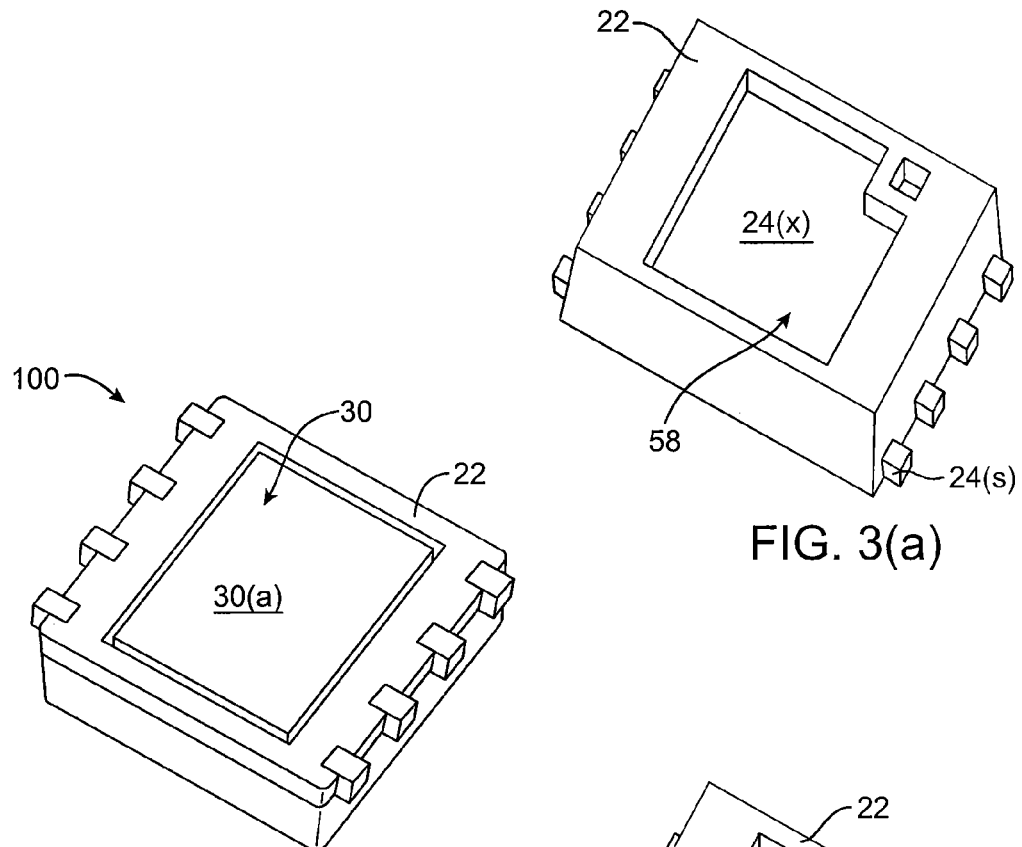
FIG. 3(a)
FIG. 3(b)
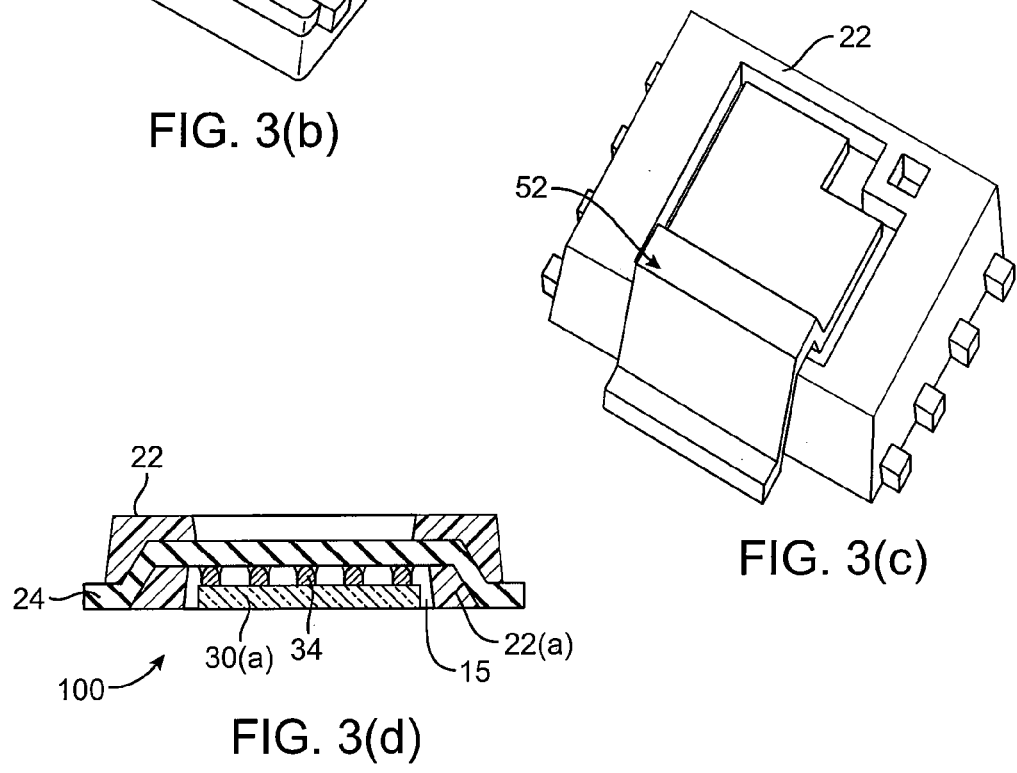
FIG. 3(c)
FIG. 3(d)

ALTERNATIVE FLIP CHIP IN LEADED MOLDED PACKAGE DESIGN AND METHOD FOR MANUFACTURE

CROSS-REFERENCE TO RELATED APPLICATIONS

This patent application is a non-provisional patent application of U.S. Patent Application No. 60/446,918, filed on Feb. 11, 2003, which is herein incorporated by reference in its entirety.

BACKGROUND OF THE INVENTION

A Flipchip in Leaded Molded Package (FLMP) is described in U.S. patent application Ser. No. 09/464,717. In a conventional FLMP package, the backside of a silicon die is exposed through a window in a molding material. The backside of the die can be in substantially direct thermal and electrical contact with a circuit substrate such as a PC board.

When the FLMP package is made, a molding process is performed after the die is attached to a leadframe structure. To keep the backside of the die clean from mold bleed or mold flash, the package is designed so that no gap is present between the mold cavity and the backside of silicon die. During manufacture, the die is contacted by a mold tool upon mold tool clamping. Since the die is brittle and since the package is thin, the potential for breakage of the die and disconnection between the die and the leadframe is of concern.

Embodiments of the invention address these and other problems.

SUMMARY OF THE INVENTION

Embodiments of the invention are directed to semiconductor packages and methods for making semiconductor packages.

One embodiment of the invention is directed to a method for making a semiconductor package comprising: (a) molding a molding material around a leadframe structure having a die attach region and a plurality of leads, wherein the die attach region is exposed through a window in the molding material; and (b) after (a), mounting a semiconductor die to the die attach region using a flip chip mounting process.

Another embodiment of the invention is directed to a semiconductor package comprising: (a) a leadframe structure comprising a die attach region and plurality of leads; (b) a molding material molded around at least a portion of the leadframe structure, and wherein the molding material comprises a window; and (c) a semiconductor die mounted on the die attach region.

Another embodiment of the invention is directed to an electrical assembly comprising: a semiconductor package comprising (a) a leadframe structure comprising a die attach region and plurality of leads, (b) a molding material molded around at least a portion of the leadframe structure and wherein the molding material comprises a window, and (c) a semiconductor die comprising an edge mounted on the die attach region, wherein the semiconductor die is within the window, and wherein a gap is present between the edge and the molding material; and a circuit substrate, wherein the semiconductor package is mounted to the circuit substrate.

These and other embodiments of the invention are described in further detail below.

BRIEF DESCRIPTION OF THE DRAWINGS

FIG. 3(a) shows a top perspective view of the package according to another embodiment of the invention.

FIG. 3(b) shows a bottom perspective view of the package in FIG. 3(a).

FIG. 3(c) shows a top perspective view the package in FIG. 3(a) with a heat plate structure.

FIG. 3(d) shows a side cross-sectional view of the package in FIGS. 3(a) and 3(b).

Figure 1A:
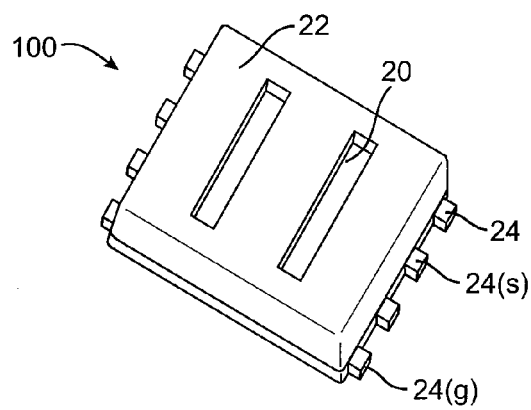
FIG. 1(a) shows a top perspective view of a semiconductor package according to an embodiment of the invention.

These and other embodiments are described in further detail below in the Detailed Description.

DETAILED DESCRIPTION

Embodiments of the invention are directed to an alternative design and method of manufacture for an FLMP package. In embodiments of the invention, mechanical stress experienced by a semiconductor die during a molding process is substantially eliminated. As indicated above, mechanical stress during the process of manufacturing a package can lead to die cracking or solder cracking. Embodiments of the invention also eliminate the possibility of mold bleed or mold resin contamination on an exposed backside of a die. Using embodiments of the invention, it is possible to create thinner packages (e.g., less than about 0.5 mm in height) where it is difficult to do so in a standard FLMP manufacturing method. In some embodiments, an opening at the top surface of the package also provides for optional use of an additional heat sink such as a heat plate structure to provide for better thermal dissipation.

The semiconductor package may use a pre-plated and/or pre-formed copper based leadframe structure, a pre-molding technique that produces a premolded leadframe structure, a solder bumped or non-solder bumped semiconductor die, and an intermediate solder paste. The details and benefits of using each of these features are explained below.

First, copper is an excellent electrical and thermal conductor so copper leadframe structures are preferred in embodiments of the invention. In some embodiments, the leadframe structure may be preplated with metals such as NiPdAu. Pre-plating the leadframe structure reduces the package's exposure to chemicals, since the finished package need not be exposed to chemicals such as plating chemicals after it is formed. Pre-plating a leadframe structure also allows one to subject the leadframe structure to high reflow temperatures without melting. Pre-forming the leadframe structure also eliminates the mechanical stresses to be absorbed by the package due to the leadforming process.

Second, a pre-molding technique may be used to form a pre-molded leadframe structure in embodiments of the invention. The premolded leadframe structure is a desirable feature of embodiments of the invention. In the premolded leadframe structure, the leadframe structure and the molding material can be locked together. The premolded leadframe structure can provide for an exposed leadframe surface for die attachment without using any film or tape. It is possible to maintain die backside planarity with respect to the exposed leads of the leadframe structure depending on the package configuration for the drain, gate and source connections to the circuit substrate (e.g., a PC board). The premolded leadframe structure includes a first window for receiving a die, and an optional second window for receiving a heat sink such as a heat plate structure (for further thermal dissipation).

Third, an array of bumps in the die may serve as the source and gate electrical terminals for a transistor die. They also serve as mechanical and thermal stress absorbers between the die and the leadframe structure. In the conventional FLMP package, the bumps are tall so that enough space is provided for a molding material to flow between the silicon die and the leadframe structure. A soft solder bump material is also ideal for a standard FLMP package to minimize the compression stress that is absorbed by the die during the molding process. In comparison, in embodiments of the invention, any bump material and shorter heights can be used, since molding is performed before die attachment to the leadframe structure. The materials and heights of the bumps are independent of molding process considerations.

In embodiments of the invention, the package can use silicon dies with thicknesses down to 0.10 mm. Also, solder paste is used to couple the bumps on a die (especially for non-solder bumps) to the leadframe structure to provide for an electrical and mechanical connection. The bumps, and solder paste can be Pb-based or Pb-free solder materials, with melting temperatures above 260° C. in some embodiments. The bumps can comprise a non-solder material like copper and gold.

Embodiments of the invention also provide for leadframe structure variations to meet desired electrical pin-out configurations and to allow for multiple dies in a single package. Embodiments of the invention also provide for a top window opening in the molding material to provide for a heatsink option. In some embodiments, it is also possible to use a thinner leadframe structure, a thinner molding material, a thinner die, and shorter bumps so that a package that is 0.50 mm or less in thickness can be produced.

FIG. 1(a) shows a package 100 according to an embodiment of the invention. The package 100 includes a molding material 22 with two holes 20 at the top of the package 100. The holes 20 may be provided to allow for better thermal dissipation from the die that is in the package 100. Any suitable molding material 22 including, for example, an epoxy molding material may be used. The package 100 also includes a number of leads 24 including a gate lead 24(g) and a plurality of source leads 24(s). The illustrated package 100 has 7 source leads and one gate lead. Other package embodiments may have more or less leads.

The leads 24 in the package 100 may be part of a leadframe structure. As used herein, the term "leadframe structure" can refer to a structure that is derived from a leadframe. A typical leadframe structure includes a source lead structure, and a gate lead structure. Each of the source lead structure and the gate lead structure can have one or more leads.

Figure 1D:
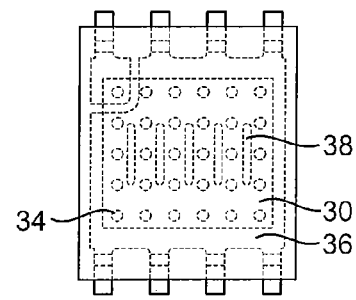
FIG. 1(d) shows a package configuration with only one die.
Figure 1B:
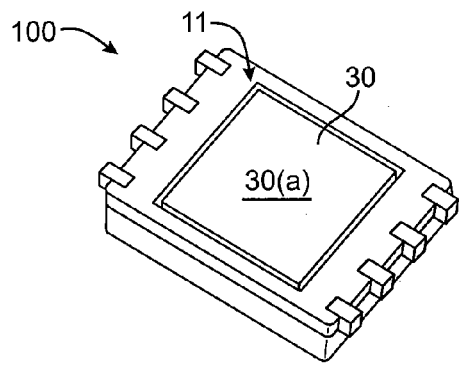
FIG. 1(b) shows a bottom perspective view of the package in FIG. 1(a).

FIG. 1(b) shows a bottom side view of the package 100. The package 100 includes a semiconductor die 30. A backside 30(a) of the semiconductor die 30 may show through a window in the molding material 22. The backside 30(a) of the die 30 corresponding to the drain region of a transistor in the die 30 may be metallized and may be distal to a die attach region of the leadframe structure. The opposite frontside of the die 30 may correspond or include a source region and a gate region and may be proximate to the die attach region of the leadframe structure. The die backside 30(a) provides for an electrical terminal, and may be coplanar with the bottom surface of the molding material 22 and coplanar with the ends of the leads 24. The window in the molding material 22 is slightly larger than the outer edges (and planar dimensions) of the die 30.

A small gap 11 is present between the molding material 22 and the outer edges of the die 30. This small gap 11 also allows the die 30 to thermally expand and contract independently of the molding material 22. As shown, the gap 11 may extend around the entire periphery of the die 30. No molding material is present between the solder joints coupling the leadframe structure and the die 30.

Figure 1C:
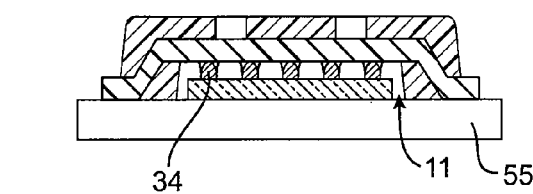
FIG. 1(c) shows a side cross-sectional view of the semiconductor package in FIGS. 1(a) and 1(b) mounted on a circuit substrate.

FIG. 1(c) shows a side cross-sectional view of an electrical assembly 103. The package 100 shown in FIGS. 1(a) and 1(b) is mounted on a circuit substrate 55 in FIG. 1(c). Solder (not shown) such as 63Sn/37Pb may be used to electrically couple the backside of the die 30 and the ends of the leads 24 to one or more conductive regions in the circuit substrate 55. As shown therein, a small gap 11 is present between the molding material 22 and the outer edges of the die 30.

FIG. 1(d) shows the leadframe structure 38. Bumps 34 are also shown attaching the die 30 to the leadframe structure 36. Apertures 38 may be present in the leadframe structure 36 to allow a molding material 22 to flow through and lock to the leadframe structure 36.

The semiconductor dies used in the semiconductor packages according to preferred embodiments of the invention include vertical power transistors. Vertical power transistors include VDMOS transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

Figure 2:
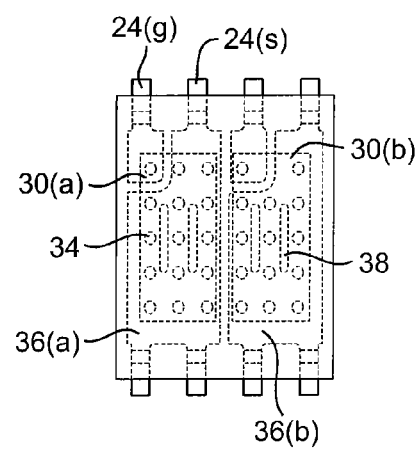
FIG. 2 shows a package configuration with two dies.

FIG. 2 shows a package 101 with two semiconductor dies 30(a), 30(b) and two corresponding leadframe structures 36(a), 36(b) within a single molding material. Each leadframe structure 36(a), 36(b) includes a gate lead and a plurality of source leads. Apertures 38 are in the die attach regions of the leadframe structures 36(a), 36(b). In other embodiments, there could be even more leadframe structures and even more dies per package.

FIG. 3(a) shows a top view of another embodiment of the invention. The package 100 includes a top window 58 in a molding material 22 that exposes the top surface 24(x) of a leadframe structure 24. The top surface 24(x) may be the surface that is opposite to the surface to which the die is attached.

FIG. 3(b) shows a bottom side view of the package 100 shown in FIG. 3(a). The package 100 includes a die 30 that is in another window in the molding material 22. As shown, the backside 30(a) of the die is exposed through the molding material 22. Thus, the package 100 may have first and second windows at opposite sides of the package 100.

FIG. 3(c) shows a metal plate structure 52 that is coupled to the top surface 24(x) of the leadframe structure 24. As shown, the metal plate structure 52 has a first portion that is planar and is coupled to the top surface 24(x) of the leadframe structure and has a leg that extends down the side of the package 100. The leg of the metal plate structure 52 may provide for an additional electrical and/or thermal connection for the package 100 to an underlying circuit substrate (not shown).

FIG. 3(d) shows a side cross-sectional view of the package 100, without a metal plate structure. As shown, a gap 15 is presented between the outer edges of the die 30 and the molding material 22. As shown, the bottom surface of the molding material 22 is coplanar with the die backside 30(a) and the ends of the leads 24(s). Also, as shown in FIG. 3(d), there is no molding material between the joints coupling the leadframe structure and the die 30.

The above-described embodiments may be manufactured in any suitable manner. For example, a first process flow option may include the following processes: 1. pre-mold/degate/deflash processes, 2. a water jet deflash process, 3. solder dispense/flipchip attach processes, and 4. a reflow process. The reflow process may be followed by: A. leadcut/test/mark processes, and B. singulate/tape and reel processes. The reflow process may alternatively be followed by singulate/test/mark/tape and reel processes. In another example, a second process flow option is as follows: 1. pre-mold/degate/deflash/leadcut processes, 2. solder dispense/flipchip attach processes, and 3. a reflow process. The reflow process may be further followed by A. a test/mark process, and B. singulate/tape and reel processes. The IR reflow process may alternatively be followed by singulate/test/mark/tape and reel processes. These individual processes are known to those of ordinary skill in the art.

Figure 4A:
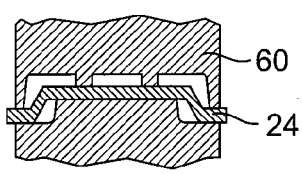
FIGS. 4(a)-4(f) show various illustrations of a package as it is being formed.

Referring to FIGS. 4(a) to 4(e), the first step is to mold the molding material 22 onto the leadframe structure 24. Referring to FIG. 4(a), the leadframe structure 24 is loaded into a mold tool 60 with a cavity designed to meet the intended predefined package thickness, form and leadframe exposure. A molding material is allowed to liquify, and enters the mold cavity and solidifies between the molding dies of the mold tool 60. After molding, the formed molded strip (if the leadframe is one of many leadframes in a strip of leadframes) goes through a degate/deflash process to remove the excess mold on the leads or leadframe structures. If the molded strip requires further cleaning, the molded strip can undergo a water jet deflash process. If no further cleaning is required, one process option is to completely cut all extended leads leaving the tiebars connected to the sides of the die attach pads of the leadframe structures. This can be done prior to the attachment of the semiconductor dies to the leadframe structures.

Figure 4B:
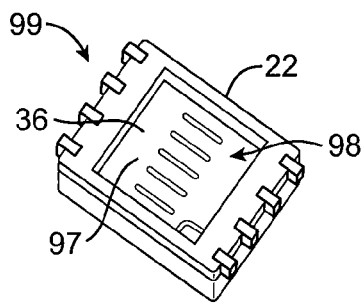

A molded leadframe structure 99 is shown in FIG. 4(b) and includes a molding material 22 and a leadframe structure. As shown, a relatively large window 98 for receiving a die is in the molding material 22. The window 98 exposes the die attach region 97 of the leadframe structure 24.

Figure 4C:
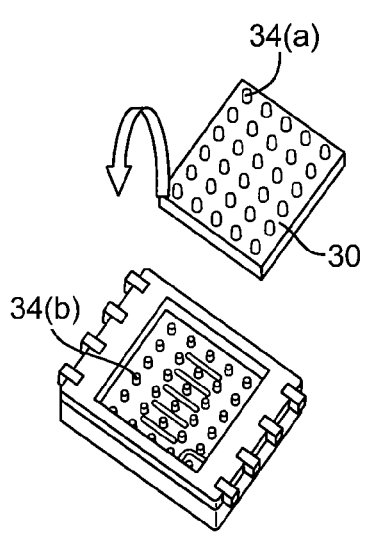

Referring to FIG. 4(c), a solder dispensing process and a flip chip attach process may be performed. The bump 34(a) comprising, for example, 95Pb/5Sn may be deposited on the die 30 in a first array. The solder material 34(b) comprising, for example, 88Pb/10Sn/2Ag may be deposited on the exposed surface of the die attach region of the leadframe structure 24 in a second array. The bump material 34(a) may have a higher melting temperature than the solder paste material 34(b). (The solder that is used to attach the finished package to a circuit substrate may have a lower melting temperature than either the bump or the solder paste materials.) As shown in FIG. 4(c), the bumped die 30 is flipped over and the arrays of bumps and solder paste materials 34(a), 34(b) are aligned and joined to form an array of joints joining the leadframe structure 24 and the die 30. As shown, the semiconductor die 30 fits within the window in the molding material 22 and a small gap is between the die 30 and the edges of the window in the molding material 22. The backside of the die 30 does not have any residual molding material, since the molding process was already performed.

Figure 4D:
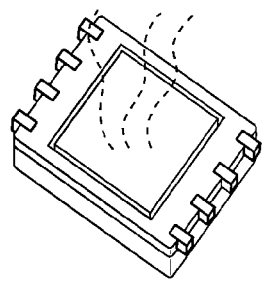

As shown in FIG. 4(d), after the die is attached to the leadframe structure, the combination goes to a reflow oven to melt the solder paste and cohesively attach the bumped silicon die to the pre-molded leadframe. Suitable reflow temperatures can be chosen by those of skill in the art.

Figure 4E:
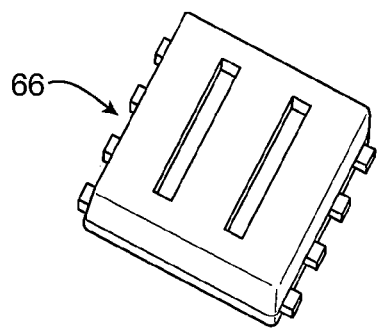
Figure 4F:
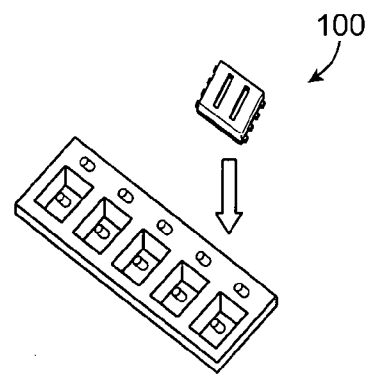

Referring to FIGS. 4(e) and 4(f), electrical testing and further processing can be done. A first approach is to perform strip testing and marking before performing singulation and then tape and reel processes. If the leads are still not cut, lead cutting can be done prior to strip testing. The second approach is to perform leadcut and singulation processes first, and then to do unit testing and marking before performing a tape and reel process. FIG. 4(f) shows a package in a tape and reel process.

Figure 5:
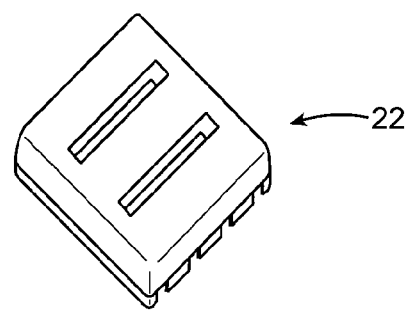
FIG. 5 shows an exploded view of a package according to an embodiment of the invention.
Figure 5:
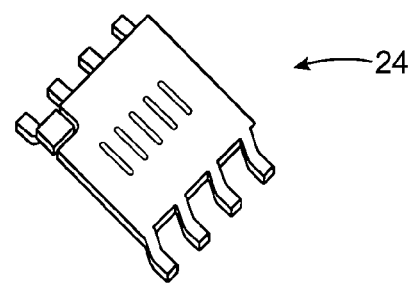
Figure 5:
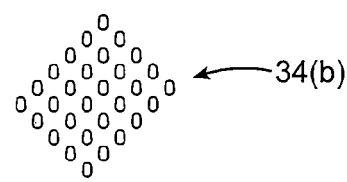
Figure 5:
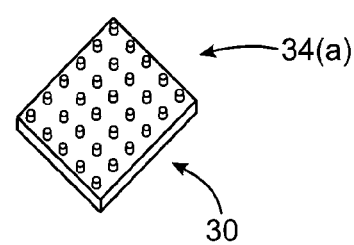

FIG. 5 shows an exploded view of a package. As shown, the package includes a molding material 22 that is coupled to a leadframe structure 24. A semiconductor die 30 with an array of bumps 34(a) is coupled to the leadframe structure 24 with a solder paste material 34(b).

It is noted that the present invention is not limited to the preferred embodiments described above, and it is apparent that variations and modifications by those skilled in the art can be performed within the spirit and scope of the present invention. Moreover, any one or more embodiment of the invention may be combined with one or more embodiments of the invention without departing from the spirit and scope of the invention.

All U.S. provisional and non-provisional patent applications and publications mentioned above are incorporated by reference in their entirety for all purposes.

What is claimed is:

1. A method for making a semiconductor package comprising:
    (a) molding a molding material around a leadframe structure having a die attach region and a plurality of leads, wherein a window and an exterior surface are formed in the molded molding material after molding, and wherein the die attach region is exposed through the window in the molding material; and
    (b) after (a), mounting a semiconductor die having a surface with an electrical terminal to the die attach region and within the window using a flip chip mounting process,
    wherein after mounting, the leads have surfaces that are substantially coplanar with the exterior surface of the molding material and the surface of the die with the electrical terminal, and wherein the surface of the die with the electrical terminal is exposed by the window in the molding material.

2. The method of claim 1 further comprising, after (b): reflowing solder that is between the die attach region of the leadframe and the semiconductor die.

3. The method of claim 1 wherein the die attach region comprises at least one aperture.

4. The method of claim 1 wherein molding comprises placing the leadframe structure in a molding tool.

5. The method of claim 1 further comprising depositing solder on the die attach region of the leadframe structure and within the window.

6. The method of claim 1 wherein the plurality of leads comprises a source lead and a gate lead.

7. The method of claim 1 further comprising:
attaching a heat plate structure to the leadframe structure.

8. The method of claim 1 wherein the electrical terminal is a drain terminal.

9. The method of claim 1 further comprising depositing a first solder on the die attach region, and depositing a second solder on the die.

10. The method of claim 1, wherein the die comprises a vertical power MOSFET including a trenched gate.

11. The method of claim 1 wherein the window is a first window and wherein a second window is formed in the molding material after molding, wherein the second window exposes a surface of the leadframe structure opposite to the die attach surface.

12. The method of claim 11 further comprising attaching a heat plate structure to the surface of the leadframe structure that is exposed through the second window.

13. The method of claim 12 wherein the heat plate structure comprises a leg that extends over a side of the molding material.

14. The method of claim 1 wherein after (b), a package is formed, and wherein the method further comprises:
mounting the package on a circuit substrate, wherein the surface of the die with the electrical terminal, the exterior surface of the molding material, and the surfaces of the leads are proximate to a surface of the circuit substrate.

15. The method of claim 14 wherein the electrical terminal is a drain terminal in a power MOSFET in the semiconductor die.

* * * * *